(12) United States Patent
Tag et al.

(10) Patent No.: US 10,917,068 B2
(45) Date of Patent: Feb. 9, 2021

(54) ACOUSTIC FILTERING CIRCUITRY

(71) Applicant: Qorvo US, Inc., Greensboro, NC (US)

(72) Inventors: Andreas Tag, Altamonte Springs, FL (US); Fabien Dumont, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/364,636

(22) Filed: Mar. 26, 2019

(65) Prior Publication Data

US 2020/0177158 A1 Jun. 4, 2020

Related U.S. Application Data

(60) Provisional application No. 62/774,731, filed on Dec. 3, 2018.

(51) Int. Cl.
*H03H 9/02* (2006.01)
*H03H 9/54* (2006.01)
*H03H 9/205* (2006.01)
*H03H 9/56* (2006.01)

(52) U.S. Cl.
CPC .... *H03H 9/02102* (2013.01); *H03H 9/02007* (2013.01); *H03H 9/205* (2013.01); *H03H 9/54* (2013.01); *H03H 9/564* (2013.01); *H03H 9/568* (2013.01)

(58) Field of Classification Search
CPC ...... H03H 9/54; H03H 9/205; H03H 9/02007; H03H 9/568; H03H 9/605; H03H 9/6483
USPC ................. 333/133, 186, 187, 188
See application file for complete search history.

(56) References Cited

U.S. PATENT DOCUMENTS 8,253,513 B2 * 8/2012 Zhang .................... H04R 17/00
                                                        310/346
2013/0249643 A1 * 9/2013 Kim ......................... H03H 9/54
                                                        333/133

(Continued)

OTHER PUBLICATIONS

Allah, M.A., et al., "Temperature Compensated Solidly Mounted Resonators with thin SiO2 layers," IEEE International Ultrasonics Symposium, 2009, pp. 859-862.
Ella, Juha, et al., "Modelling of ZnO-based BAWs at high signal levels," IEEE International Ultrasonics Symposium, Oct. 2002, pp. 985-988.

(Continued)

*Primary Examiner* — Rakesh B Patel
*Assistant Examiner* — Jorge L Salazar, Jr.
(74) *Attorney, Agent, or Firm* — Withrow & Terranova, P.L.L.C.

(57) ABSTRACT

Acoustic filtering circuitry includes an input node, an output node, a signal transmission path, a series acoustic resonator, and a shunt acoustic resonator. The signal transmission path is between the input node and the output node. The series acoustic resonator is coupled between the input node and the output node in the signal transmission path. Further, a temperature coefficient of frequency (TCF) of a parallel resonance frequency of the series acoustic resonator is positive. The shunt acoustic resonator is coupled between the signal transmission path and ground. Further, a TCF of a series resonance frequency of the shunt acoustic resonator is negative. By providing the TCF of the series acoustic resonator and the shunt acoustic resonator in this manner, self-heating of the acoustic filtering circuitry may be significantly reduced, thereby improving the performance of the acoustic filtering circuitry.

17 Claims, 11 Drawing Sheets

(56) References Cited

OTHER PUBLICATIONS

Ivira, B., et al., "Integrated split 3-BAR resonator structure for higher power handling capability," IEEE International Ultrasonics Symposium, Oct. 2016, 6 pages.

Lakin, K.M., et al., "Temperature Compensated Bulk Acoustic Thin Film Resonators," IEEE Ultrasonics Symposium, 2000, pp. 855-858.

Nishihara, Tokihiro, "Increased Piezoelectric Coupling Factor in Temperature-Compensated Film Bulk Acoustic Resonators," IEEE International Ultrasonics Symposium, 2015, 4 pages.

Tag, A., et al., "A Method for Accurate modeling of BAW filters at High Power Levels," IEEE Transactions on Ultrasonics, Ferroelectrics, and Frequency Control, vol. 63, Issue 8, Aug. 2016, 8 pages.

Tajic, A., et al., "No-drift BAW-SMR: Over-moded Reflector for Temperature Compensation," IEEE International Ultrasonics Symposium, 2016, 4 pages.

Van Der Wel, P.J., et al., "Thermal Behaviour and Reliability of Solidly Mounted Bulk Acoustic Wave Duplexers under High Power RF Loads," 47th Annual International Reliability Physics Symposium, Apr. 2009, Montreal, Canada, pp. 557-561.

Wunnicke, Olaf, et al., "Thermal Behavior of BAW Filters at High RF Power Levels," IEEE Transactions on Ultrasonics, Ferroelectrics, and Frequency Control, vol. 56, Issue 12, Dec. 2009, pp. 2686-269.

\* cited by examiner

ACOUSTIC FILTERING CIRCUITRY

RELATED APPLICATIONS

This application claims the benefit of provisional patent application Ser. No. 62/774,731, filed Dec. 3, 2018, the disclosure of which is hereby incorporated herein by reference in its entirety.

FIELD OF THE DISCLOSURE

The present disclosure is related to acoustic filtering circuitry, and in particular to acoustic filtering circuitry configured to reduce self-heating and improve performance at high power.

BACKGROUND

Acoustic filtering circuitry is nearly ubiquitous in modern wireless communications systems. In particular, acoustic filtering circuitry is used in wireless communications systems to separate signals in different frequency bands from one another. These frequency bands are defined by wireless communications standards, which continue to evolve and increase the number of frequency bands used for wireless communications to accommodate for features such as carrier aggregation. As this occurs, the gaps in frequency spectrum between frequency bands decrease, thereby increasing the required selectivity of acoustic filtering circuitry to properly isolate signals within a particular frequency band. At the same time, the insertion loss of acoustic filtering circuitry needs to remain below a certain level so that received signals can be properly processed and transmitted signals can be properly amplified and sent. Additionally, acoustic filtering circuitry needs to meet stringent linearity requirements. Finally, acoustic filtering circuitry needs to remain small due to the decreasing amount of space available in modern wireless communications devices. In light of the above, there is a present need for acoustic filtering circuitry with improved performance to meet the stringent demands of evolving wireless communications standards.

SUMMARY

In one embodiment, acoustic filtering circuitry includes an input node, an output node, a signal transmission path, a series acoustic resonator, and a shunt acoustic resonator. The signal transmission path is between the input node and the output node. The series acoustic resonator is coupled between the input node and the output node in the signal transmission path. Further, a temperature coefficient of frequency (TCF) of a parallel resonance frequency of the series acoustic resonator is positive. The shunt acoustic resonator is coupled between the signal transmission path and ground. Further, a TCF of a series resonance frequency of the shunt acoustic resonator is negative. By providing the TCF of the series acoustic resonator and the shunt acoustic resonator in this manner, self-heating of the acoustic filtering circuitry may be significantly reduced, thereby improving the performance of the acoustic filtering circuitry.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
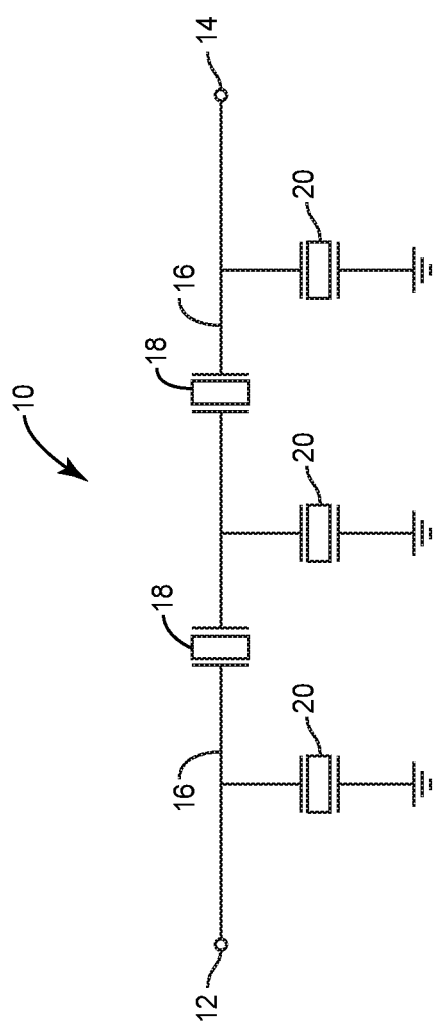
FIG. 1 is a schematic illustrating acoustic filtering circuitry according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows acoustic filtering circuitry 10 according to one embodiment of the present disclosure. The acoustic filtering circuitry 10 includes an input node 12, an output node 14, a signal transmission path 16 between the input node 12 and the output node 14, a number of series acoustic resonators 18 coupled in series in the signal transmission path 16 between the input node 12 and the output node 14, and a number of shunt acoustic resonators 20 coupled in parallel between the signal transmission path 16 and ground. The number and configuration of the series acoustic resonators 18 and the shunt acoustic resonators 20 is merely exemplary. The acoustic filtering circuitry 10 can include any number of series acoustic resonators 18 and shunt acoustic resonators 20, including as little as one series acoustic resonator 18 and one shunt acoustic resonator 20, without departing from the principles of the present disclosure.

In operation, a signal is provided at the input node 12. As the signal travels along the signal transmission path 16, each one of the series acoustic resonators 18 and the shunt acoustic resonators 20 provide a different impedance based on the frequency of the signal, thereby passing certain components of the signal along the signal transmission path 16 and shunting certain components of the signal to ground. Accordingly, a filtered version of the signal is provided at the output node 14.

Figure 2:
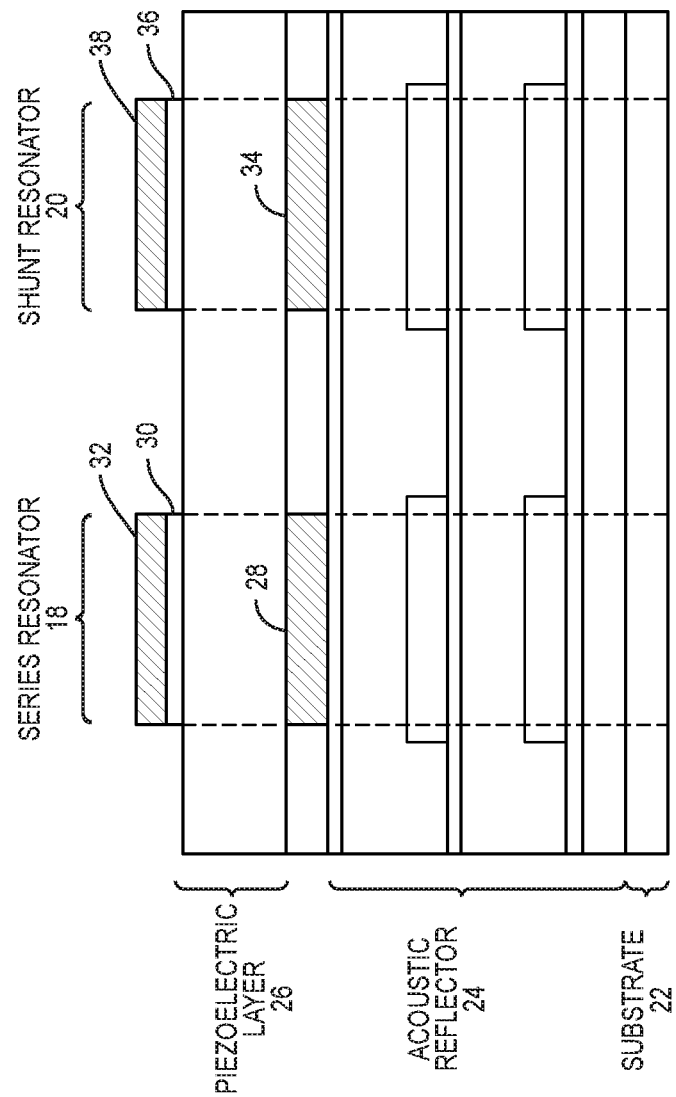
FIG. 2 illustrates a cross-sectional view of acoustic resonators without compensation for self-heating according to one embodiment of the present disclosure.

FIG. 2 shows a cross-sectional view of one of the series acoustic resonators 18 and one of the shunt acoustic resonators 20 according to one embodiment of the present disclosure in which the acoustic resonators are bulk acoustic wave (BAW) resonators. The series acoustic resonator 18 and the shunt acoustic resonator 20 are made up of a number of layers including a substrate 22, an acoustic reflector 24 on the substrate 22, and a piezoelectric layer 26. The series acoustic resonator 18 includes the substrate 22, the acoustic reflector 24, a series bottom electrode 28 on the acoustic reflector 24 opposite the substrate 22, the piezoelectric layer 26 on the series bottom electrode 28 opposite the acoustic reflector 24, a series detune layer 30 on the piezoelectric layer 26 opposite the series bottom electrode 28, and a series top electrode 32 on the series detune layer 30 opposite the piezoelectric layer 26 such that the piezoelectric layer 26 is between the series bottom electrode 28 and the series top electrode 32.

The shunt acoustic resonator 20 includes the substrate 22, the acoustic reflector 24, a shunt bottom electrode 34 on the acoustic reflector 24 opposite the substrate 22, the piezoelectric layer 26 on the shunt bottom electrode 34 opposite the acoustic reflector 24, a shunt detune layer 36 on the piezoelectric layer 26 opposite the shunt bottom electrode 34, and a shunt top electrode 38 on the shunt detune layer 36 opposite the piezoelectric layer 26 such that the piezoelectric layer 26 is between the shunt bottom electrode 34 and the shunt top electrode 38.

The series acoustic resonator 18 and the shunt acoustic resonator 20 are acoustically isolated from one another by some portion of intervening material in the lateral space between them. The substrate 22 may comprise silicon (Si). The acoustic reflector 24 may comprise alternating layers of different materials. For exemplary purposes, the acoustic reflector 24 is shown including alternating layers of silicon dioxide ($SiO_2$) 24A, aluminum nitride (AlN) 24B, and Tungsten (W) 24C. While shown as a single layer, the series bottom electrode 28, the series top electrode 32, the shunt bottom electrode 34, and the shunt top electrode 38 may comprise alternating layers of titanium tungsten (TiW), aluminum copper (AlCu), and tungsten (W). While not shown, the top of the series acoustic resonator 18 and the shunt acoustic resonator 20, including the series top electrode 32 and the shunt top electrode 38, may be covered in a layer of silicon nitride (SiN). The series detune layer 30 and the shunt detune layer 36 may comprise tungsten (W). Those skilled in the art will readily appreciate that the principles of the present disclosure apply to any combination of materials suitable for the construction of an acoustic resonator device, and that the particular combination and arrangement of materials discussed herein is merely for purposes of demonstration.

Those skilled in the art will appreciate that each one of the series acoustic resonator 18 and the shunt acoustic resonator 20 has an associated series resonance frequency and parallel resonance frequency. The series resonance frequency of each one of the series acoustic resonator 18 and the shunt acoustic resonator 20 is the frequency at which the phase of the impedance thereof crosses zero with positive slope and the magnitude of the impedance thereof is at a minimum. The parallel resonance frequency of each one of the series acoustic resonator 18 and the shunt acoustic resonator 20 is the frequency at which the phase of the impedance thereof crosses zero with negative slope and the magnitude of the impedance thereof is at a maximum.

The vertical structure of the series acoustic resonator 18 and the shunt acoustic resonator 20 are identical aside from the thickness of the series detune layer 30 and the shunt detune layer 36. The thickness of the series detune layer 30 determines the parallel resonance frequency of the series acoustic resonator 18, while the thickness of the shunt detune layer 36 determines the parallel resonance frequency of the shunt acoustic resonator 20. Accordingly, the thickness of the series detune layer 30 and the shunt detune layer 36 are adjusted individually to produce a desired filter response in the acoustic filtering circuitry 10.

Notably, the series resonance frequency and the parallel resonance frequency of acoustic resonators such as the series acoustic resonator 18 and the shunt acoustic resonator 20 have a dependence on the temperature of the device. This is quantified by a temperature coefficient of frequency (TCF), which describes how the series resonance frequency and the parallel resonance frequency of an acoustic resonator behave with respect to a temperature of the device. The TCF may be different for the series resonance frequency and the parallel resonance frequency, although they are generally close to one another and have the same sign. A positive TCF means that the frequency increases with increasing temperature, while a negative TCF means that the frequency decreases with increasing temperature.

A portion of the power of a signal provided to the acoustic filtering circuitry 10 is absorbed by the acoustic resonators therein and thus will lead to an increase in the temperature thereof. This is known as self-heating. Due to the TCF of the series resonant frequency and the parallel resonant frequency of an acoustic resonator, the passband of the acoustic filtering circuitry 10 will change due to this self-heating. Without compensation to counteract and/or reduce self-heating, the performance of the acoustic filtering circuitry 10 may significantly suffer.

Figure 3A:
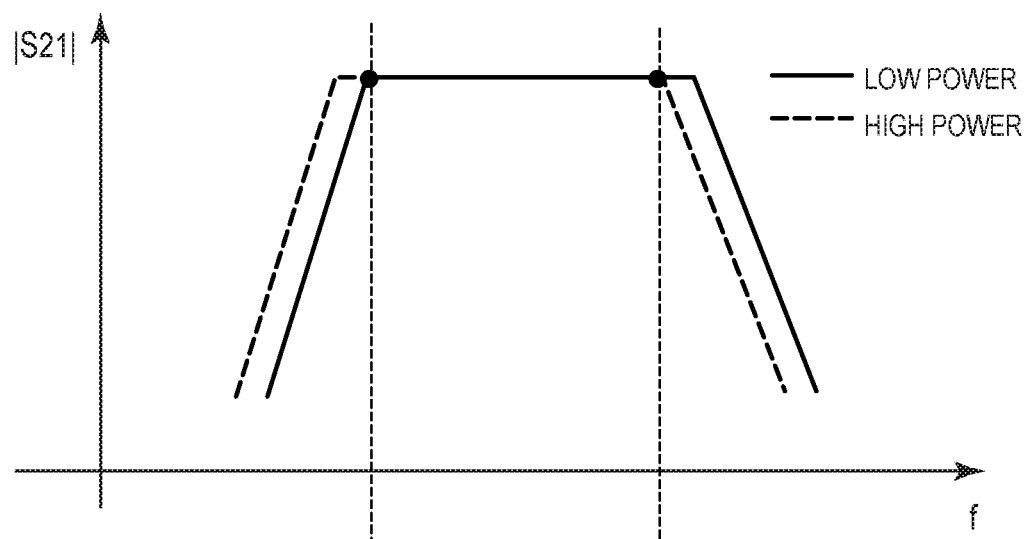
FIGS. 3A and 3B are graphs illustrating a response of acoustic filtering circuitry without compensation for self-heating according to one embodiment of the present disclosure.
Figure 3B:
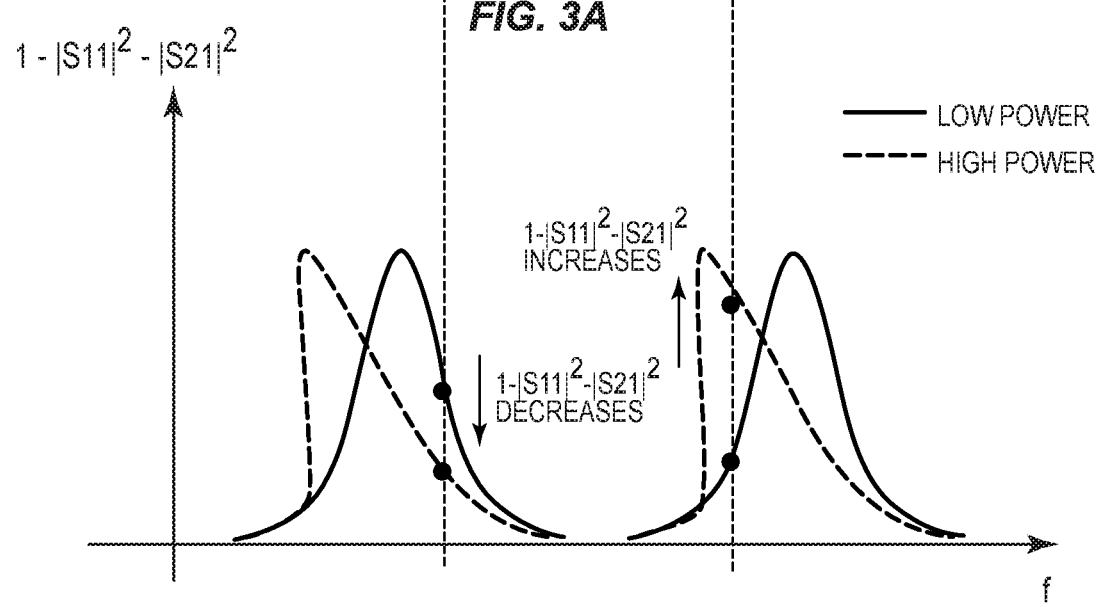

FIGS. 3A and 3B illustrate the effect of self-heating on the acoustic filtering circuitry 10 without compensation. Specifically, FIG. 3A is a graph illustrating a filter response of the acoustic filtering circuitry 10 ($|S_{21}|$) and FIG. 3B is a graph illustrating a value proportional to a power dissipation of the acoustic filtering circuitry 10 ($1-|S_{11}|^2-|S_{21}|^2$) surrounding a passband of the acoustic filtering circuitry 10 (shown by the vertical dashed lines through both graphs), where power dissipation is described by $P_{dis}=P_{in}*(1-|S_{11}|^2-|S_{21}|^2)$. A solid line in FIG. 3A illustrates the filter response of the acoustic filtering circuitry 10 when a low-power signal is provided at the input node 12 while a dashed line illustrates the filter response of the acoustic filtering circuitry 10 when a high-power signal is provided at the input node 12. Similarly, a solid line in FIG. 3B illustrates the power dissipation of the acoustic filtering circuitry 10 when a low-power signal is provided at the input node 12 while a dashed line illustrates the power dissipation of the acoustic filtering circuitry 10 when a high-power signal is provided at the input node.

As discussed above, the series acoustic resonators 18 and the shunt acoustic resonators 20 may be bulk acoustic wave (BAW) resonators. These devices often exhibit a negative TCF for both the series resonant frequency and the parallel resonant frequency. Accordingly, FIGS. 3A and 3B illustrate the effect of this negative TCF on the filter response and power dissipation of the acoustic filtering circuitry 10. As shown, the power dissipated in the acoustic filtering circuitry 10 is frequency dependent and is usually higher at the edges of the passband as compared to the middle of the passband. For low power signals, most of the dissipated power in the acoustic filtering circuitry 10 is outside of the passband thereof. However, as power increases, self-heating occurs causing the passband of the acoustic filtering circuitry 10 to shift lower in frequency. That is, both a lower filter skirt and an upper filter skirt of the passband of the acoustic filtering circuitry 10 shift lower in frequency. As this occurs, the power dissipation response of the acoustic filtering circuitry 10 also shifts lower in frequency such that a lower spike in power dissipation near the lower edge of the passband shifts further away from the passband, while an upper spike in power dissipation previously above the upper edge of the passband shifts into the passband. The shifting of the upper spike in power dissipation into the passband may further accelerate self-heating and degrade the performance of the acoustic filtering circuitry 10.

Figure 4A:
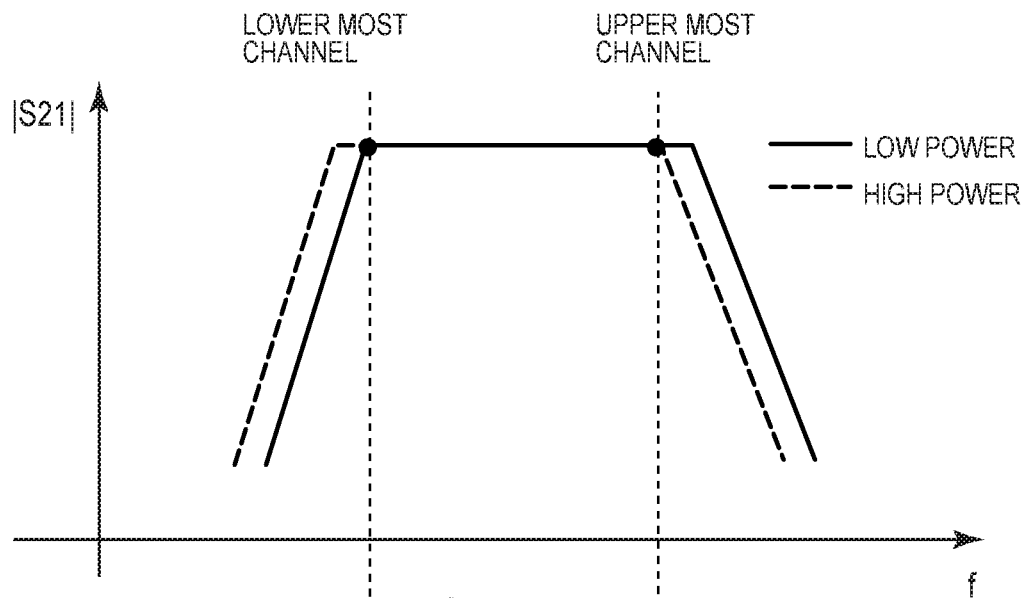
FIGS. 4A and 4B are graphs illustrating a response of acoustic filtering circuitry with compensation for self-heating according to one embodiment of the present disclosure.
Figure 4B:
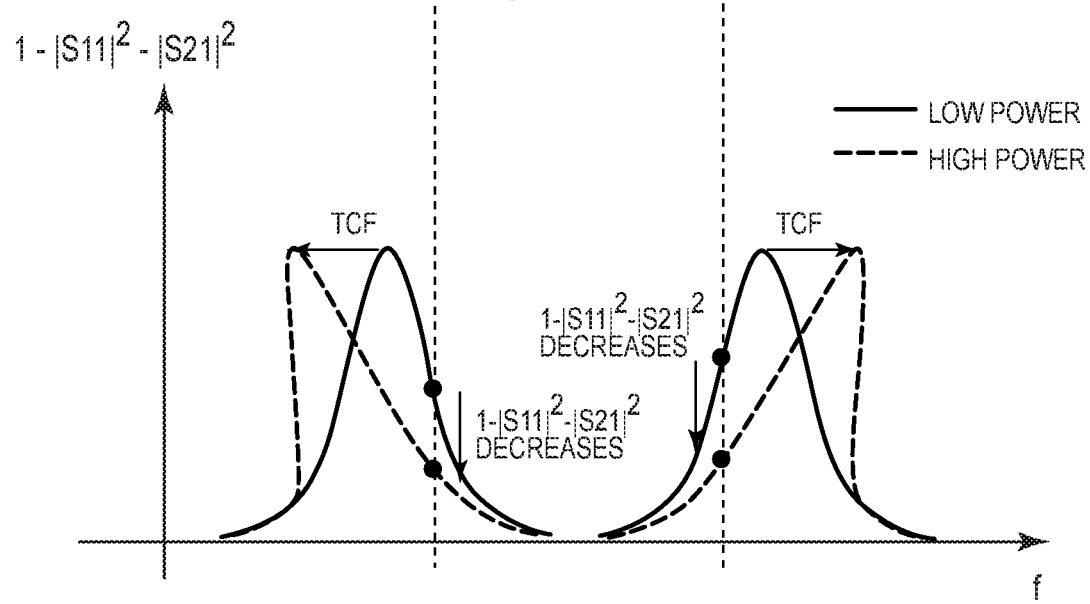

FIGS. 4A and 4B illustrate the effect of self-heating on the acoustic filtering circuitry 10 with compensation to reduce self-heating. Specifically, FIG. 4A is a graph illustrating a filter response of the acoustic filtering circuitry 10 ($|S_{21}|$) and FIG. 4B is a graph illustrating a value proportional to a power dissipation of the acoustic filtering circuitry 10 ($1-|S_{11}|^2-|S_{21}|^2$) surrounding a passband of the acoustic filtering circuitry 10 (shown by the vertical dashed lines through both graphs). A solid line in FIG. 4A illustrates the filter response of the acoustic filtering circuitry 10 when a low-power signal is provided at the input node 12 while a dashed line illustrates the filter response of the acoustic filtering circuitry 10 when a high-power signal is provided at the input node 12. Similarly, a solid line in FIG. 4B illustrates the power dissipation of the acoustic filtering circuitry 10 when a low-power signal is provided at the input node 12 while a dashed line illustrates the power dissipation of the acoustic filtering circuitry 10 when a high-power signal is provided at the input node.

As shown in FIGS. 4A and 4B, for low power signals the filter response and power dissipation are essentially identical to those for the acoustic filtering circuitry 10 without compensation to reduce self-heating. However, at high power the passband of the acoustic filtering circuitry 10 expands such that a lower filter skirt thereof moves down in frequency while an upper filter skirt thereof moves up in frequency. This effectively increases the bandwidth of the passband of the acoustic filtering circuitry 10. As this occurs, the power dissipation response of the acoustic filtering circuitry 10 follows such that a lower spike in power dissipation near the lower edge of the passband shifts down in frequency further away from the passband, while an upper spike in power dissipation near the upper edge of the passband shifts up in frequency, also further away from the passband. Accordingly, the power dissipation within the passband decreases, which may decelerate and/or reverse self-heating and therefore improve the performance of the acoustic filtering circuitry 10 at high power.

The desired response discussed above with respect to FIGS. 4A and 4B can be achieved by designing the series acoustic resonators 18 and the shunt acoustic resonators 20 to shift the frequency of the lower filter skirt of the filter response of the acoustic filtering circuitry 10 down in frequency with temperature and shift the frequency of the upper filter skirt of the filter response up in frequency with temperature. This can be accomplished by providing one or more of the series acoustic resonators 18 with a parallel resonance frequency that has a positive TCF and providing one or more of the shunt acoustic resonators 20 with a series resonance frequency that has a negative TCF. Generally speaking, this cannot be achieved with conventional acoustic resonators, as they do not include a mechanism by which to independently adjust the TCF of the parallel resonance frequency of one resonator and the TCF of the series resonance frequency of another resonator to achieve a negative TCF on the lower filter skirt and, at the same time, a positive TCF at the upper filter skirt.

Figure 5:
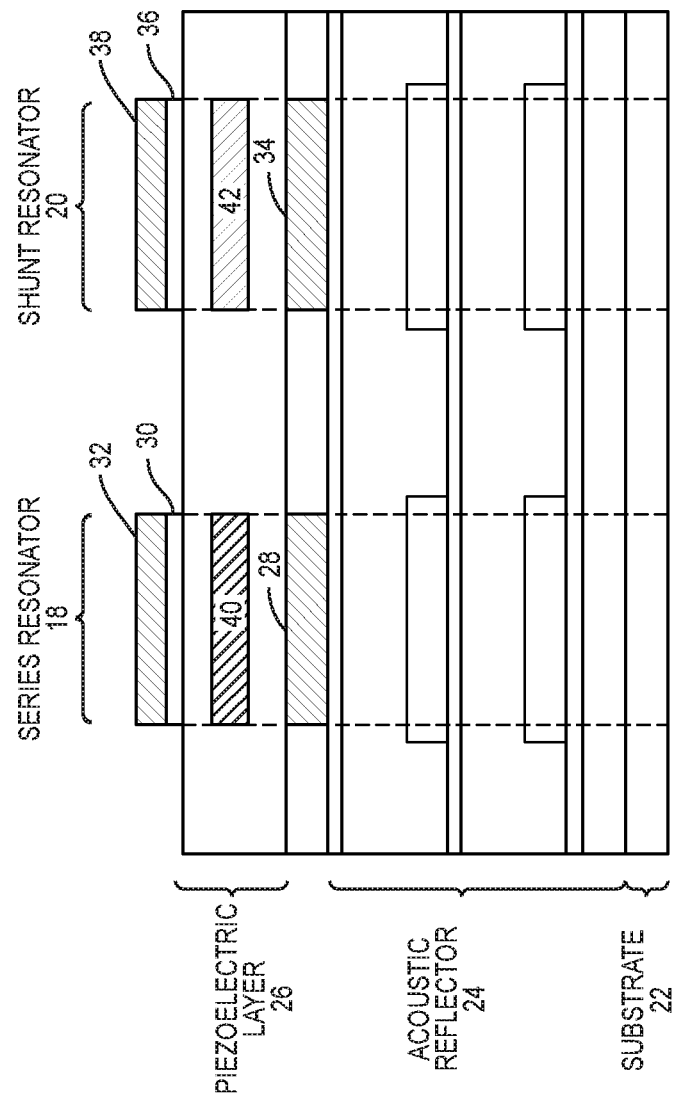
FIG. 5 illustrates a cross-sectional view of acoustic resonators with compensation for self-heating according to one embodiment of the present disclosure.

FIG. 5 shows a cross-sectional view of the series acoustic resonator 18 and the shunt acoustic resonator 20 including compensation for self-heating according to one embodiment of the present disclosure. The series acoustic resonator 18 and the shunt acoustic resonator 20 are substantially similar to those shown above in FIG. 2, except that the series acoustic resonator 18 includes a series temperature coefficient adjustment layer 40 and the shunt acoustic resonator 20 includes a shunt temperature coefficient adjustment layer 42. The series temperature coefficient adjustment layer 40 is located in the piezoelectric layer 26 such that a portion of the piezoelectric layer 26 is located between the series temperature coefficient adjustment layer 40 and the series bottom electrode 28 and between the series temperature coefficient adjustment layer 40 and the series detune layer 30. Similarly, the shunt temperature coefficient adjustment layer 42 is located in the piezoelectric layer 26 such that a portion of the piezoelectric layer 26 is located between the shunt temperature coefficient adjustment layer 42 and the shunt bottom electrode 34 and between the shunt temperature coefficient adjustment layer 42 and the shunt detune layer 36.

Notably, a temperature coefficient of acoustic velocity (TCV) of the material of the series temperature coefficient adjustment layer 40 is higher than a TCV of the material of the shunt temperature coefficient adjustment layer 42. This is illustrated with different shading for these layers. Further, while not shown, a thickness of the series temperature coefficient adjustment layer 40 may be different from a thickness of the shunt temperature coefficient adjustment layer 42. In yet another embodiment, the shunt temperature coefficient adjustment layer 42 may be omitted while keeping the series temperature coefficient adjustment layer 40. The effect of the series temperature coefficient adjustment layer 40 is to create a positive TCF of the parallel resonance frequency of the series acoustic resonator 18. The effect of the shunt temperature coefficient adjustment layer 42 is to maintain a negative TCF of the series resonance frequency of the shunt acoustic resonator 20. As discussed above, BAW devices normally have a negative TCF for both the series resonant frequency and the parallel resonant frequency. The series temperature coefficient adjustment layer 40 may counteract this inherent negative TCF to make the overall TCF of the series acoustic resonator 18 positive, while the shunt temperature coefficient adjustment layer 42 may adjust the TCF of the device up or down as desired, while maintaining the overall TCF of the shunt acoustic resonator 20 negative.

Figure 6:
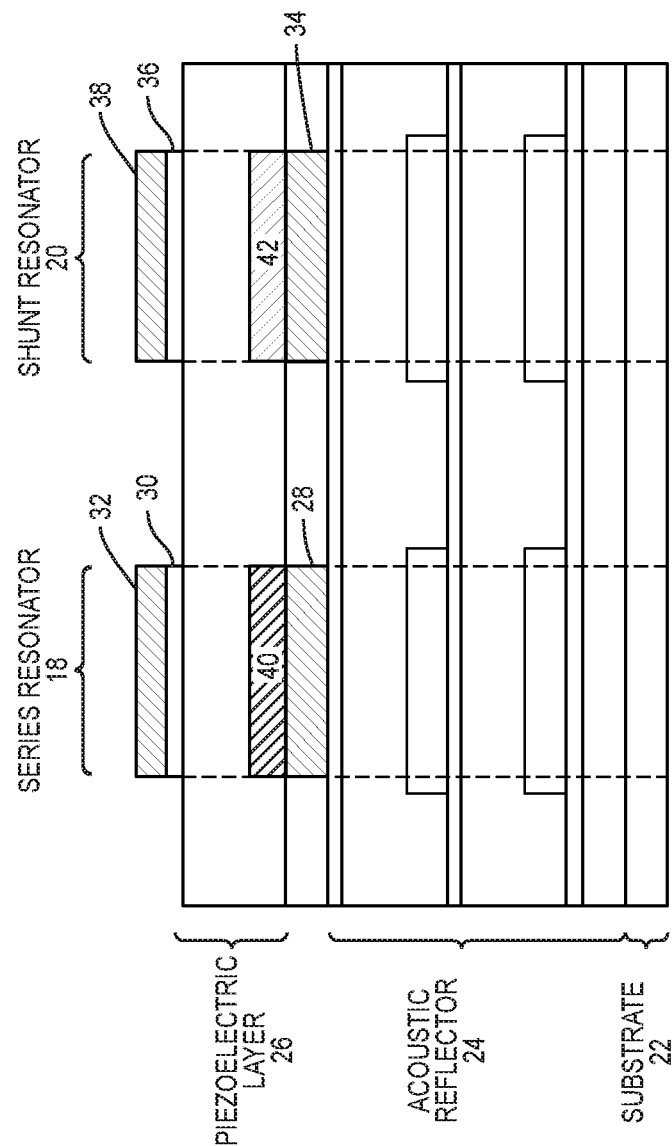
FIG. 6 illustrates a cross-sectional view of acoustic resonators with compensation for self-heating according to one embodiment of the present disclosure.

FIG. 6 shows a cross-sectional view of the series acoustic resonator 18 and the shunt acoustic resonator 20 including compensation for self-heating according to one embodiment of the present disclosure. The series acoustic resonator 18 and the shunt acoustic resonator 20 are substantially similar to those shown above in FIG. 5, except that the series temperature coefficient adjustment layer 40 is on the series bottom electrode 28 such that the series temperature coefficient adjustment layer 40 is between the series bottom electrode 28 and the piezoelectric layer 26. Further, the shunt temperature coefficient adjustment layer 42 is on the shunt bottom electrode 34 such that the shunt temperature coefficient adjustment layer 42 is between the shunt bottom electrode 34 and the piezoelectric layer 26.

Figure 7:
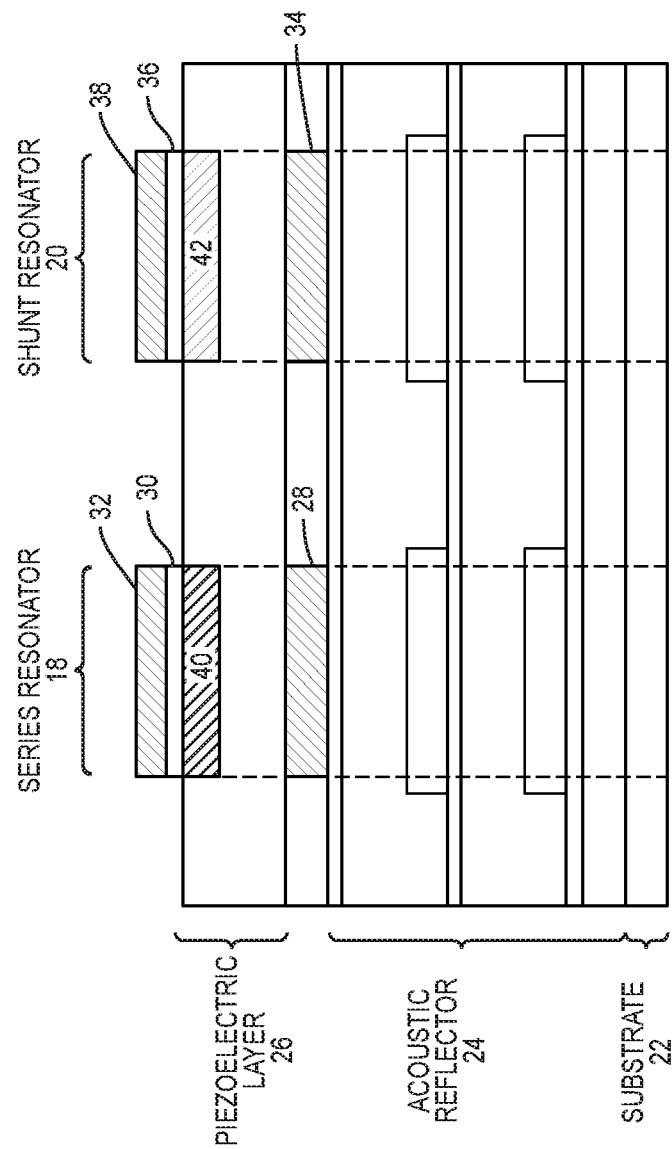
FIG. 7 illustrates a cross-sectional view of acoustic resonators with compensation for self-heating according to one embodiment of the present disclosure.

FIG. 7 shows a cross-sectional view of the series acoustic resonator 18 and the shunt acoustic resonator 20 including compensation for self-heating according to one embodiment of the present disclosure. The series acoustic resonator 18 and the shunt acoustic resonator 20 are substantially similar to that those shown above in FIG. 5, except that the series temperature coefficient adjustment layer 40 is between the piezoelectric layer 26 and the series detune layer 30. Further, the shunt temperature coefficient adjustment layer 42 is between the piezoelectric layer 26 and the shunt detune layer 36.

Those skilled in the art will readily appreciate that the series temperature coefficient adjustment layer 40 and the shunt temperature coefficient adjustment layer 42 may be located anywhere in the piezoelectric layer 26 within the series acoustic resonator 18 and the shunt acoustic resonator 20, respectively, without departing from the principles of the present disclosure. Further, while the series temperature coefficient adjustment layer 40 and the shunt temperature coefficient adjustment layer 42 are both shown as a single layer, they may also be provided as multiple contiguous or non-contiguous layers.

Figure 8:
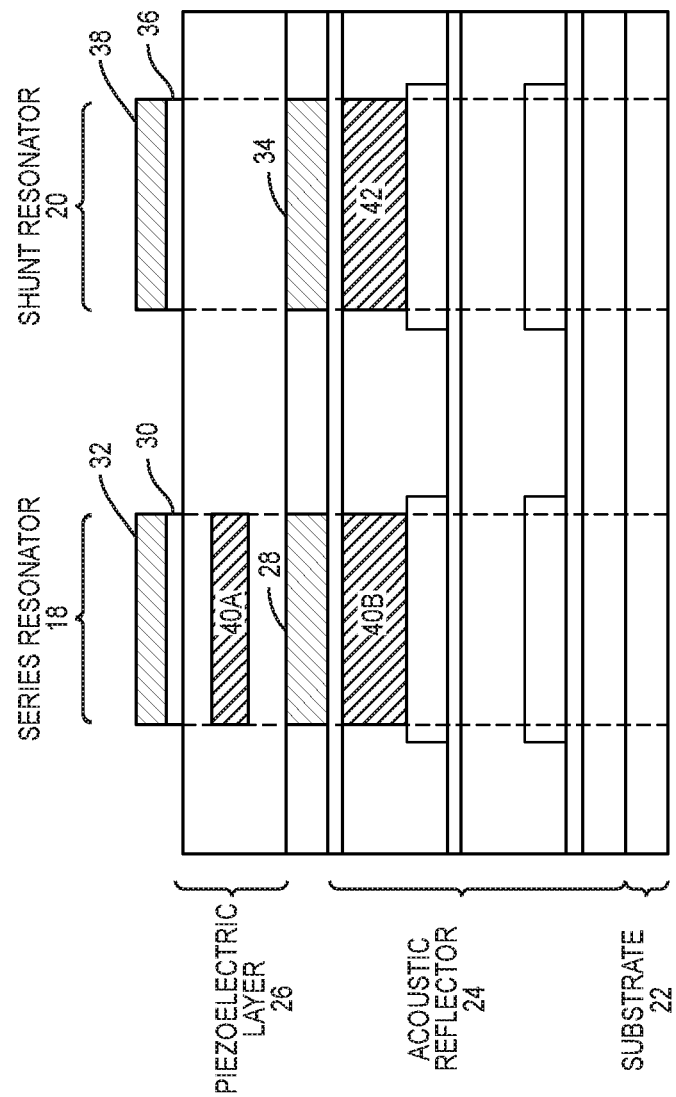
FIG. 8 illustrates a cross-sectional view of acoustic resonators with compensation for self-heating according to one embodiment of the present disclosure.

FIG. 8 shows a cross-sectional view of the series acoustic resonator 18 and the shunt acoustic resonator 20 including compensation for self-heating according to one embodiment of the present disclosure. The series acoustic resonator 18 and the shunt acoustic resonator 20 are substantially similar to those shown above in FIG. 5, except that the series temperature coefficient adjustment layer 40 is provided as two layers, one located in the piezoelectric layer 26 and one located in the acoustic reflector 24. Specifically, a first series temperature coefficient adjustment layer 40A is located in the piezoelectric layer 26 within the series acoustic resonator 18 such that a portion of the piezoelectric layer 26 is located between the first series temperature coefficient adjustment layer 40A and the series bottom electrode 28 and between the first series temperature coefficient adjustment layer 40A and the series detune layer 30. A second series temperature coefficient adjustment layer 40B is located in the acoustic reflector 24 within the series acoustic resonator 18. Further, the shunt temperature coefficient adjustment layer 42 is located in the same location of the acoustic reflector 24 within the shunt acoustic resonator 20. While the second series temperature coefficient adjustment layer 40B and the shunt temperature coefficient adjustment layer 42 are shown in a particular location in the acoustic reflector 24, they may be provided at any location within the acoustic reflector 24.

Figure 9:
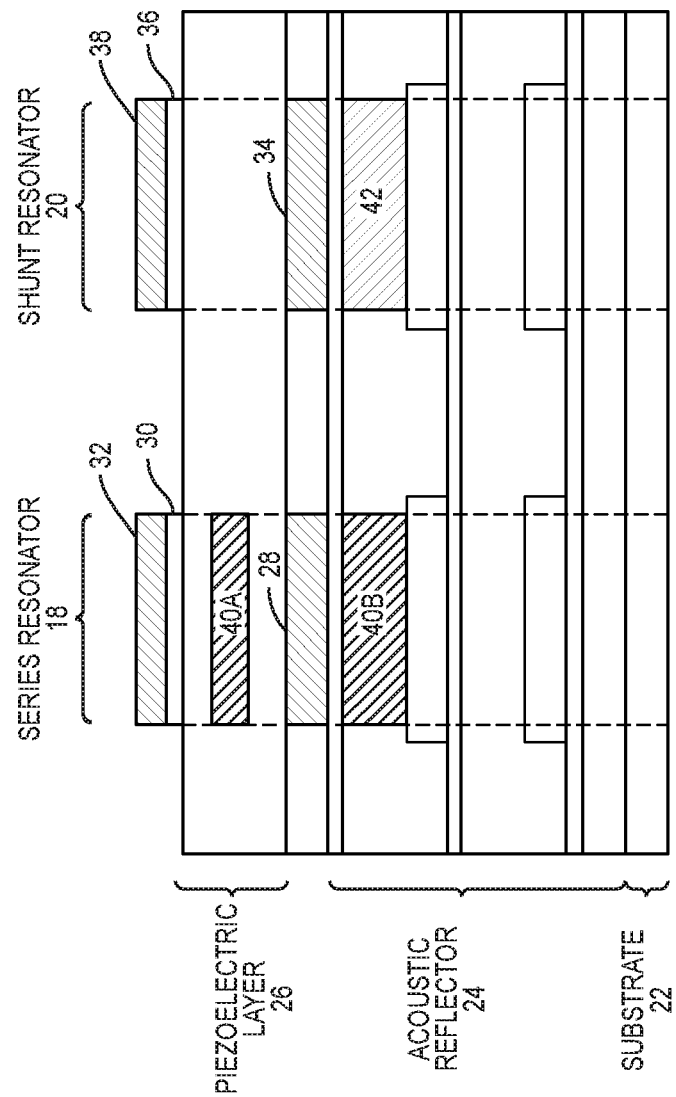
FIG. 9 illustrates a cross-sectional view of acoustic resonators with compensation for self-heating according to one embodiment of the present disclosure.

Notably, a total thickness of the series temperature coefficient adjustment layer 40 is greater than a total thickness of the shunt temperature coefficient adjustment layer 42. This may allow the material of the series temperature coefficient adjustment layer 40 to have the same TCV as the material of the shunt temperature coefficient adjustment layer 42 while still providing the desired TCF for the series acoustic resonator 18 and the shunt acoustic resonator 20 discussed above. Accordingly, the series temperature coefficient adjustment layer 40 and the shunt temperature coefficient adjustment layer 42 are illustrated using the same shading to indicate that the materials for these layers may have the same TCV. However, both the total thickness and the TCV of the material of the series temperature coefficient adjustment layer 40 and the shunt temperature coefficient adjustment layer 42 may also be different, as illustrated by the different shading for these layers in FIG. 9. While not shown in FIG. 9, in some embodiments the first series temperature coefficient adjustment layer 40A may be omitted such that only the second series temperature coefficient adjustment layer 40B and the shunt temperature coefficient adjustment layer 42 perform the functionality discussed above.

Figure 10:
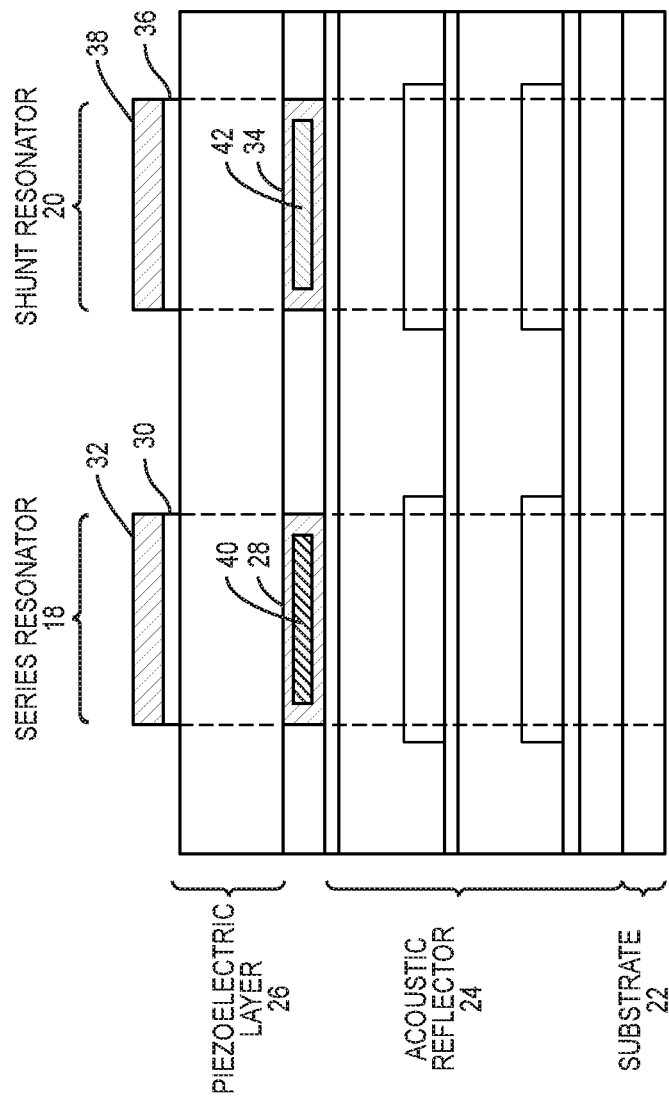
FIG. 10 illustrates a cross-sectional view of acoustic resonators with compensation for self-heating according to one embodiment of the present disclosure.

FIG. 10 shows a cross-sectional view of the series acoustic resonator 18 and the shunt acoustic resonator 20 including compensation for self-heating according to one embodiment of the present disclosure. The series acoustic resonator 18 and the shunt acoustic resonator 20 are substantially similar to those shown above in FIG. 5, except that the series temperature coefficient adjustment layer 40 is located in the series bottom electrode 28 and the shunt temperature coefficient adjustment layer 42 is located in the shunt bottom electrode 34. In particular, a portion of the series bottom electrode 28 is located between the series temperature coefficient adjustment layer 40 and the piezoelectric layer 26 and between the series temperature coefficient adjustment layer 40 and the acoustic reflector 24. Further, a portion of the shunt bottom electrode 34 is located between the shunt temperature coefficient adjustment layer 42 and the piezoelectric layer 26 and between the shunt temperature coefficient adjustment layer 42 and the acoustic reflector 24.

Notably, FIGS. 5 through 10 are merely exemplary. Those skilled in the art will readily appreciate that the location, relative thicknesses, and relative TCV of the series temperature coefficient adjustment layer 40 and the shunt temperature coefficient adjustment layer 42 may be provided in numerous permutations to achieve the desired TCF for the series acoustic resonator 18 and the shunt acoustic resonator 20 discussed above, all of which are contemplated herein. In various embodiments, the series temperature coefficient adjustment layer 40 and the shunt temperature coefficient adjustment layer 42 may comprise silicon dioxide ($SiO_2$) doped with one of fluorine (F), chlorine (Cl), phosphorous (P), sulfur (S), nitrogen (N), or carbon (C). Further, the series temperature coefficient adjustment layer 40 and the shunt temperature coefficient adjustment layer 42 may comprise single-crystal silicon (Si) or poly-silicon. Alternatively, the function of the series temperature coefficient adjustment layer 40 and the shunt temperature coefficient adjustment layer 42 may be provided by one or several different metal or piezoelectric materials with different TCV for the series acoustic resonator 18 and the shunt acoustic resonator 20. In general, any material with the desired TCV may be used to achieve the desired TCF for the series acoustic resonator 18 and the shunt acoustic resonator 20 discussed above.

Figure 11:
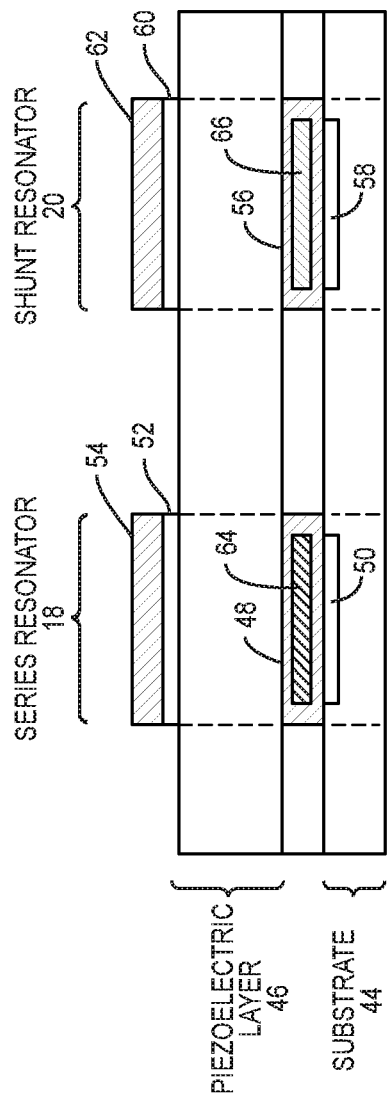
FIG. 11 illustrates a cross-sectional view of acoustic resonators with compensation for self-heating according to one embodiment of the present disclosure.

While the above examples are given for BAW devices, the principles of the present disclosure apply equally to other acoustic resonators such as thin-film bulk acoustic wave (FBAR) devices. FIG. 11 shows a cross-sectional view of the series acoustic resonator 18 and the shunt acoustic resonator 20 including compensation for self-heating according to one embodiment of the present disclosure in which the acoustic resonators are FBAR resonators. The series acoustic resonator 18 and the shunt acoustic resonator 20 are made up of a number of layers including a substrate 44 and a piezoelectric layer 46. The series acoustic resonator 18 includes the substrate 44, a series bottom electrode 48 on the substrate 44 over a first air gap 50 in the substrate 44, the piezoelectric layer 46 on the series bottom electrode 48 opposite the substrate 44, a series detune layer 52 on the piezoelectric layer 46 opposite the series bottom electrode 48, and a series top electrode 54 on the series detune layer 52 opposite the piezoelectric layer 46. The shunt acoustic resonator 20 includes the substrate 44, a shunt bottom electrode 56 on the substrate 44 over a second air gap 58 in the substrate 44, the piezoelectric layer 46 on the shunt bottom electrode 56 opposite the substrate 44, a shunt detune layer 60 on the piezoelectric layer 46 opposite the shunt bottom electrode 56, and a top shunt electrode 62 on the shunt detune layer 60 opposite the piezoelectric layer 46. A series temperature coefficient adjustment layer 64 is in the series bottom electrode 48 such that a portion of the series bottom electrode 48 is between the series temperature coefficient adjustment layer 64 and the piezoelectric layer 46 and between the series temperature coefficient adjustment layer 64 and the first air gap 50/substrate 44. A shunt temperature coefficient adjustment layer 66 is in the shunt bottom electrode 56 such that a portion of the shunt bottom electrode 56 is located between the shunt temperature coefficient adjustment layer 66 and the piezoelectric layer 46 and between the shunt temperature coefficient adjustment layer 66 and the second air gap 58/substrate 44. The series temperature coefficient adjustment layer 64 and the shunt temperature coefficient adjustment layer 66 may have the same properties as those discussed above with respect to the series temperature coefficient adjustment layer 40 and the shunt temperature coefficient adjustment layer 42 in order to provide the desired TCF of the series acoustic resonator 18 and the shunt acoustic resonator 20 discussed above.

Those skilled in the art will recognize improvements and modifications to the preferred embodiments of the present disclosure. All such improvements and modifications are considered within the scope of the concepts disclosed herein and the claims that follow.

What is claimed is:

1. Acoustic filtering circuitry comprising:
   an input node;
   an output node;
   a signal transmission path between the input node and the output node;
   a series acoustic resonator coupled between the input node and the output node in the signal transmission path, wherein a temperature coefficient of frequency (TCF) of a parallel resonance frequency of the series acoustic resonator is positive; and
   a shunt acoustic resonator coupled between the signal transmission path and ground, wherein a TCF of a series resonance frequency of the shunt acoustic resonator is negative.

2. The acoustic filtering circuitry of claim 1, wherein the series acoustic resonator and the shunt acoustic resonator are bulk acoustic wave (BAW) resonators.

3. The acoustic filtering circuitry of claim 1, wherein the series acoustic resonator and the shunt acoustic resonator are thin film bulk acoustic wave (FBAR) resonators.

4. The acoustic filtering circuitry of claim 1, further comprising:
   one or more additional series acoustic resonators coupled in series with the series acoustic resonator between the input node and the output node in the signal transmission path; and
   one or more additional shunt acoustic resonators coupled in parallel with the shunt acoustic resonator between the signal transmission path and ground.

5. The acoustic filtering circuitry of claim 4, wherein:
   a TCF of a parallel resonance frequency of each of the one or more additional series acoustic resonators is positive; and
   a TCF of a series resonance frequency of each of the one or more additional shunt acoustic resonators is negative.

6. The acoustic filtering circuitry of claim 1, wherein:
the series acoustic resonator comprises a piezoelectric layer between a series top electrode and a series bottom electrode; and
the shunt acoustic resonator comprises the piezoelectric layer between a shunt top electrode and a shunt bottom electrode.

7. The acoustic filtering circuitry of claim 6, wherein:
the series acoustic resonator further comprises a series temperature coefficient adjustment layer having a first temperature coefficient of acoustic velocity (TCV); and
the shunt acoustic resonator further comprises a shunt temperature coefficient adjustment layer having a second TCV that is less than the first TCV.

8. The acoustic filtering circuitry of claim 7, wherein:
the series temperature coefficient adjustment layer is between the piezoelectric layer and the series bottom electrode; and
the shunt temperature coefficient adjustment layer is between the piezoelectric layer and the shunt bottom electrode.

9. The acoustic filtering circuitry of claim 7, wherein:
the series temperature coefficient adjustment layer is between the piezoelectric layer and the series top electrode; and
the shunt temperature coefficient adjustment layer is between the piezoelectric layer and the shunt top electrode.

10. The acoustic filtering circuitry of claim 7, wherein:
the series temperature coefficient adjustment layer is in the piezoelectric layer such that a portion of the piezoelectric layer is between the series temperature coefficient adjustment layer and the series top electrode and between the series temperature coefficient adjustment layer and the series bottom electrode; and
the shunt temperature coefficient adjustment layer is in the piezoelectric layer such that a portion of the piezoelectric layer is between the shunt temperature coefficient adjustment layer and the shunt top electrode and between the shunt temperature coefficient adjustment layer and the shunt bottom electrode.

11. The acoustic filtering circuitry of claim 7, further comprising:
a series acoustic reflector on which the series bottom electrode is provided, wherein the series temperature coefficient adjustment layer is in the series acoustic reflector; and
a shunt acoustic reflector on which the shunt bottom electrode is provided, wherein the shunt temperature coefficient adjustment layer is in the shunt acoustic reflector.

12. The acoustic filtering circuitry of claim 7, wherein:
the series temperature coefficient adjustment layer is in the series bottom electrode such that a portion of the series bottom electrode is between the series temperature coefficient adjustment layer and the piezoelectric layer; and
the shunt temperature coefficient adjustment layer is in the shunt bottom electrode such that a portion of the shunt bottom electrode is between the shunt temperature coefficient adjustment layer and the piezoelectric layer.

13. The acoustic filtering circuitry of claim 6, wherein:
the series acoustic resonator further comprises one or more series temperature coefficient adjustment layers; and
the shunt acoustic resonator further comprises one or more shunt temperature coefficient adjustment layers, wherein a total thickness of the one or more series temperature coefficient adjustment layers is greater than a thickness of the one or more shunt temperature coefficient adjustment layers.

14. The acoustic filtering circuitry of claim 13, wherein a temperature coefficient of acoustic velocity (TCV) of the one or more series temperature coefficient adjustment layers is the same as a TCV of the one or more shunt temperature coefficient adjustment layers.

15. The acoustic filtering circuitry of claim 13, wherein a temperature coefficient of acoustic velocity (TCV) of the one or more series temperature coefficient adjustment layers is greater than a TCV of the one or more shunt temperature coefficient adjustment layers.

16. The acoustic filtering circuitry of claim 13, further comprising:
a series acoustic reflector on which the series bottom electrode is provided; and
a shunt acoustic reflector on which the shunt bottom electrode is provided.

17. The acoustic filtering circuitry of claim 16, wherein:
a first one of the one or more series temperature coefficient adjustment layers is in the series acoustic reflector and a second one of the one or more series temperature coefficient adjustment layers is in the piezoelectric layer of the series acoustic resonator; and
a first one of the one or more shunt temperature coefficient adjustment layers is in the shunt acoustic reflector.

* * * * *